United States Patent
Hashimoto (10) Patent No.: US 7,432,585 B2
(45) Date of Patent: Oct. 7, 2008

(54) SEMICONDUCTOR DEVICE ELECTRONIC COMPONENT, CIRCUIT BOARD, AND ELECTRONIC DEVICE

(75) Inventor: Nobuaki Hashimoto, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/500,264

(22) Filed: Aug. 7, 2006

(65) Prior Publication Data

US 2007/0035000 A1 Feb. 15, 2007

(30) Foreign Application Priority Data

Aug. 10, 2005 (JP) ............... 2005-231573

(51) Int. Cl.
*H01L 23/02* (2006.01)
*H01L 21/44* (2006.01)

(52) U.S. Cl. ............... 257/679; 257/E23.021; 257/E23.064; 257/E23.146; 257/E25.011; 257/737; 257/738; 257/778; 257/690; 257/698; 257/673; 257/784

(58) Field of Classification Search ........... 257/679, 257/737, E23.064, E23.021, E23.146, E25.011, 257/738, 778, 696, 698, 690, 691, 692, 693, 257/673, 784, 779, 780
See application file for complete search history.

(56) References Cited

U.S. PATENT DOCUMENTS

| | | | |
|---|---|---|---|
| 6,154,940 A * | 12/2000 | Onishi et al. ............... 29/25.35 |
| 6,228,684 B1 | 5/2001 | Maruyama |
| 6,515,370 B2 | 2/2003 | Hashimoto |
| 6,707,153 B2 | 3/2004 | Kuwabara |
| 6,762,431 B2 | 7/2004 | Maruyama |
| 6,836,002 B2 | 12/2004 | Chikawa et al. |
| 6,847,066 B2 * | 1/2005 | Tahara et al. ............... 257/243 |
| 6,888,209 B2 * | 5/2005 | Jobetto ............... 257/459 |
| 7,042,081 B2 * | 5/2006 | Wakisaka et al. ............... 257/700 |
| 7,071,487 B2 | 7/2006 | Maruyama |
| 7,199,459 B2 * | 4/2007 | Pu et al. ............... 257/686 |
| 7,247,947 B2 * | 7/2007 | Wakabayashi et al. ....... 257/758 |
| 2002/0017730 A1 * | 2/2002 | Tahara et al. ............... 257/786 |
| 2004/0155351 A1 | 8/2004 | Miyamamoto et al. |
| 2005/0046006 A1 | 3/2005 | Yeom |
| 2005/0062147 A1 * | 3/2005 | Wakisaka et al. ............... 257/712 |
| 2005/0084989 A1 * | 4/2005 | Wakabayashi et al. ......... 438/14 |
| 2006/0202201 A1 | 9/2006 | Maruyama |

(Continued)

FOREIGN PATENT DOCUMENTS

CN 1259767 7/2000

(Continued)

OTHER PUBLICATIONS

"The Technology and Development of System in Package", Long LE, China Academic Journal Electronic Publishing House, pp. 15-19, Mar. 31, 2004 (with English translation).

*Primary Examiner*—Alexander O Williams
(74) *Attorney, Agent, or Firm*—Harness, Dickey & Pierce, P.L.C.

(57) ABSTRACT

A semiconductor device includes: a semiconductor substrate having an active face; a first electrode provided on or above the active face; an external connection terminal provided on or above the active face and electrically connected to the first electrode; and a connection terminal provided on or above the active face of the semiconductor substrate.

14 Claims, 6 Drawing Sheets

U.S. PATENT DOCUMENTS

2007/0164432 A1 * 7/2007 Wakisaka et al. ........... 257/737

FOREIGN PATENT DOCUMENTS

| CN | 1314708 A | 9/2001 |
|---|---|---|
| JP | 2000-216253 | 8/2000 |
| JP | 2002-016212 | 1/2002 |
| JP | 2003-086733 | 3/2003 |
| JP | 2003-152132 | 5/2003 |
| JP | 2004-165415 | 6/2004 |
| WO | 98/40915 | 9/1998 |
| WO | WO 01/71805 | 9/2001 |

* cited by examiner

SEMICONDUCTOR DEVICE ELECTRONIC COMPONENT, CIRCUIT BOARD, AND ELECTRONIC DEVICE

CROSS-REFERENCE TO RELATED APPLICATION

This application claims priority from Japanese Patent Application No. 2005-231573, filed Aug. 10, 2005, the contents of which are incorporated herein by reference.

BACKGROUND

1. Technical Field

The present invention relates to a semiconductor device, a manufacturing method for a semiconductor device, an electronic component, a circuit board, and an electronic device.

2. Related Art

A bare-chip packaging is ideal for a high-density packaging of a semiconductor device.

However, the bare-chip has problems in that it is difficult to maintain its quality, to handle it, and so on.

Thus, semiconductor devices applied with Chip Scale/Size Package (CSP) have been developed.

Recently, in particular, as disclosed in Domestic Re-publication of PCT International Publication for Patent Application No. 01/071805 and Japanese Unexamined Patent Application, First Publication No. 2004-165415, a so-called wafer level CSP (W-CSP), in which a CSP is formed at a wafer level, has received attention.

In a wafer level CSP, a plurality of semiconductor elements (integrated circuits) provided with a relocated wiring are formed on a wafer, and the wafer is cut into each semiconductor element (integrated circuit) to obtain an individual semiconductor device.

Semiconductor devices are often used as driving devices for driving, for example, a crystal oscillator, a Micro Electro Mechanical Systems (MEMS) structure, various electronic component structures, or the like.

There is an increased demand to reduce the size of such structures and driving devices (semiconductor devices) since they are often used in portable products such as mobile telephones.

Accordingly, integrating such a structure and a semiconductor device for driving the structure into an electronic component, and miniaturizing an aggregate (electronic component) of a structure and a semiconductor device, are conceived.

Especially for semiconductor devices, it is possible to further miniaturize the semiconductor device using a semiconductor device to which the wafer level CSP is applied.

However, in the semiconductor device to which the above-mentioned wafer level SCP is applied, only a connection to a circuit board, or the like, in which the semiconductor device is packaged is assumed. Therefore, external terminals as connection terminals have a configuration such that they are utilized only for packaging in a circuit board, or the like.

Thus, under the present circumstances, it is extremely difficult to form an electronic component by integrating this semiconductor device and the above structure due to their configuration.

SUMMARY

An advantage of some aspects of the invention is to provide a semiconductor device, a manufacturing method for a semiconductor device, an electronic component, a circuit board, and an electronic device which can integrate with various structures, miniaturize an electronic component obtained thereby, and obtain a semiconductor device to which a wafer level CSP is applied.

A first aspect of the invention provides a semiconductor device, including: a semiconductor substrate having an active face; a first electrode provided on or above the active face; an external connection terminal provided on or above the active face and electrically connected to the first electrode; and a connection terminal provided on or above the active face of the semiconductor substrate.

According to this semiconductor device, the connection terminal provided in addition to an external connection terminal can be used for mechanical or electrical connection with, for instance, another functional structure (a finctional structure different from that to which the external connection terminal is connected). With this configuration, it is possible to integrate the semiconductor device and the functional structure into an electronic component, thus miniaturize the electronic component.

It is preferable that the semiconductor device of the first aspect of the invention further include: a relocated wiring electrically connecting the first electrode with the external connection terminal and provided on or above the active face.

With this configuration, it is possible to allow a free (optional) design of positioning or layout of an external connection terminal.

It is preferable that the semiconductor device of the first aspect of the invention further include: a second electrode electrically connected with the connection terminal and provided on or above the active face of the semiconductor substrate.

With this configuration, it is possible to perform electrical processing of the semiconductor device using the connection terminal.

Furthermore, it is possible for the semiconductor device to function, for example, as a driving element for the functional structure by electrically connecting this semiconductor device with the functional structure using the connection terminal.

It is preferable that, in the semiconductor device of the first aspect of the invention, the connection terminal be used when an electrical checkup or adjustment is performed.

With this configuration, it is possible to functionally check or adjust the semiconductor using the connection terminal instead of using techniques of, for example, an electric checkup, trimming, or the like.

It is preferable that, in the semiconductor device of the first aspect of the invention, the connection terminal be a terminal for electrically connecting to a component different from that connected to the external connection terminal.

With this configuration, it is possible for this semiconductor device to function as a driving element for the functional structure by electrically connecting the semiconductor device with another functional structure using the connection terminal.

It is preferable that the semiconductor device of the first aspect of the invention further include: a stress-relieving layer provided between the semiconductor substrate and the external connection terminal; and an interconnection layer connecting the external connection terminal with the first electrode.

With this configuration, it is possible to form a relocated wiring in this semiconductor device by the electrical connection of the first electrode with the external connection terminal via the interconnection layer, therefore providing the external connection terminal with wider freedom of size, shape, arrangement, etc.

Furthermore, the provision of the stress-relieving layer offers higher connection reliability via the external connection terminal between the semiconductor device and the external apparatus, etc.

It is preferable that the semiconductor device of the first aspect of the invention further include: a sealing resin sealing the connection terminal.

When the connection terminal is sealed with the sealing resin after an electrical checkup or adjustment using the connection terminal, it is not possible to perform subsequent adjustment, or the like, using the connection terminal.

Thus, it is possible to increase the reliability of the semiconductor device after the checkup or the adjustment.

Furthermore, when the connection terminal is sealed with the sealing resin after the electrical checkup or adjustment using the connection terminal, an unexpected short-circuiting in this connection terminal can be prevented, and in addition, bonding strength in this connection terminal can be enhanced.

It is preferable that, in the semiconductor device of the first aspect of the invention, the connection terminal be formed in a columnar shape.

With this configuration, it is possible for the columnar shaped connection terminal, for example, to function as an upper- and lower-layers conductive member for electrically conducting a lower layer conductive portion and an upper layer conductive portion, enhancing freedom of the relocated wiring of the overall semiconductor device.

A second aspect of the invention provides a manufacturing method for a semiconductor device, including: preparing a semiconductor substrate having an active face; forming a first electrode on or above the active face of the semiconductor substrate; forming, on or above the active face of the semiconductor substrate, an external connection terminal; electrically connecting the external connection terminal to the first electrode; and forming a connection terminal on or above the active face of the semiconductor substrate.

In this manufacturing method for the semiconductor device, the connection terminal other than the external connection terminal is provided on or above the active face of the semiconductor substrate. Therefore, the semiconductor device obtained by this method can be mechanically or electrically connected to, for example, another functional structure using the connection terminal.

Furthermore, it is possible to integrate the semiconductor device and the functional structure into an electronic component, thus miniaturize the electronic component.

It is preferable that the manufacturing method for semiconductor device of the second aspect of the invention further include: forming a second electrode on or above the active face of the semiconductor substrate; and electrically connecting the connection terminal with the second electrode., thereby electrically connecting the connection terminal with the second electrode.

It is possible to allow electrical processing of the obtained semiconductor device using the connection terminal.

Moreover, it is possible for this semiconductor device to function, for example, as a driving element for the functional structure by electrically connecting the semiconductor device with another functional structure using the connection terminal.

It is preferable that the manufacturing method for semiconductor device of the second aspect of the invention further include: forming a plurality of the semiconductor devices on one substrate; and cutting the substrate, thereby obtaining the individual semiconductor devices.

It is possible to efficiently manufacture the semiconductor devices, therefore reducing the cost of the semiconductor devices.

It is preferable that the manufacturing method for semiconductor device of the second aspect of the invention further include: performing a checkup, an adjustment, or a connection using the connection terminal after the forming of the connection terminal; and subsequently sealing the connection terminal with a sealing resin.

When the connection terminal is sealed with the sealing resin after using the connection terminal for the electrical checkup or adjustment, subsequent adjustment, or the like, using the connection terminal is not possible.

Thus, it is possible to increase the reliability of the semiconductor device after the checkup or an adjustment.

When the connection terminal is sealed with the sealing resin after the electrical checkup or adjustment using the connection terminal, an unexpected short-circuiting in this connection terminal can be prevented, and in addition, bonding strength in this connection terminal can be enhanced.

A third aspect of the invention provides an electronic component, including: a semiconductor device including: a semiconductor substrate having an active face; a first electrode provided on or above the active face of the semiconductor substrate; an external terminal provided on or above the active face and electrically connected to the first electrode; and a connection terminal provided on or above the active face of the semiconductor substrate; a functional structure disposed on or above a face on an opposite side of the active face of the semiconductor substrate in the semiconductor device; and a conductive connection portion electrically connecting the functional structure with the connection terminal.

This electronic component connects the semiconductor device with the functional structure utilizing the connection terminal and using the conductive connection portion. With this configuration, it is possible to integrate the semiconductor device and the functional structure into the electronic component, thus miniaturize the electronic component.

It is preferable that, in the electronic component of the third aspect of the invention, the conductive connection portion be formed by wire-bonding.

With this configuration, it is possible to easily obtain a three-dimensional configuration of the semiconductor device and the functional structure.

It is preferable that, in the electronic component of the third aspect of the invention, the top of the external connection terminal be higher than that of the conductive connection portion.

It is possible to prevent interference by a wire when the electronic component is connected with the external apparatus, or the like, using the external connection terminal, thus providing a desirably connection.

It is preferable that the electronic component of the third aspect of the invention further include: a sealing resin for sealing the conductive connection portion.

It is possible to increases the reliability as an electronic component because of the protection of the conductive connection portion by the sealing resin, providing a configuration advantageous for mass production of the electronic components.

A fourth aspect of the invention provides a circuit board, including the above described electronic component. In the circuit board of the fourth aspect invention, the electronic component is packaged on the circuit board.

Since this circuit board on which a miniaturized electronic component is packaged, accordingly, high density packaging can be realized. Therefore, function of the circuit board can be enhanced.

A fifth aspect of the invention provides an electronic device, including the above described electronic component. In the electronic device of the fifth aspect invention, the electronic component is packaged in the electronic device.

Since this electronic device in which a miniaturized electronic component is packaged, accordingly, high density packaging can be realized. Therefore, function of the electronic device can be enhanced.

DESCRIPTION OF EXEMPLARY EMBODIMENTS

This invention will be described in detail.
Semiconductor Device

Figure 1:
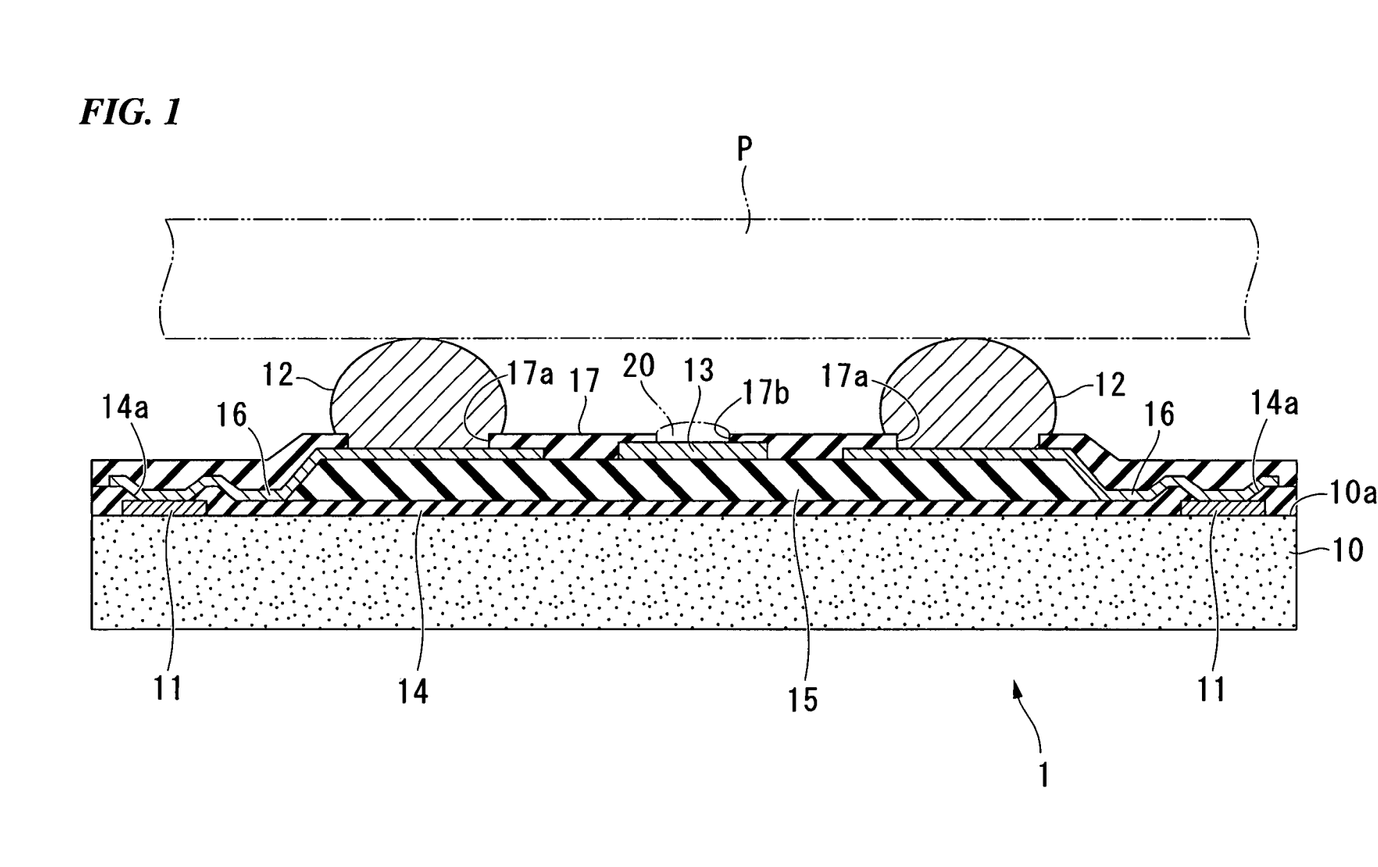
FIG. 1 is a cross-sectional view of an embodiment of a semiconductor device according to this invention.
Figure 2:
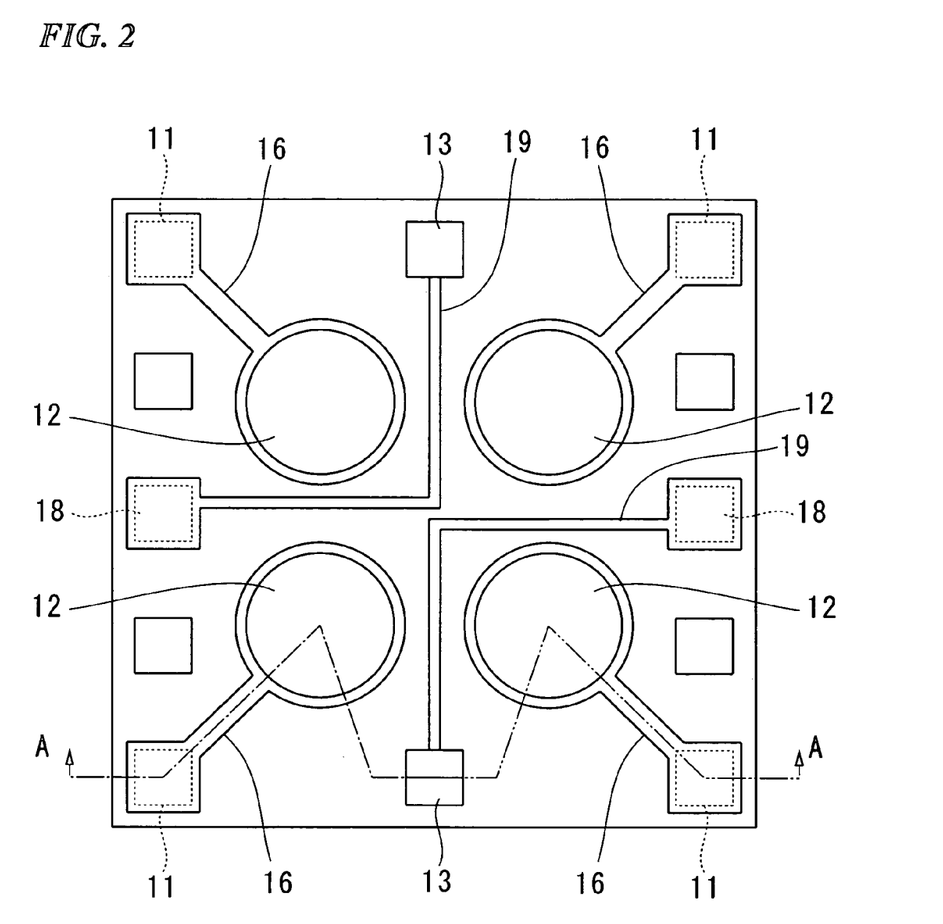
FIG. 2 is a schematic plan view of the semiconductor device of FIG. 1.

FIGS. 1 and 2 show an embodiment of a semiconductor device according to this invention. In FIGS. 1 and 2, reference numeral 1 denotes a semiconductor device including a wafer level CSP (W-CSP) configuration.

FIG. 1 is a cross-sectional view taken along the line A-A in a schematic plan view of FIG. 2.

As shown in FIG. 1, the semiconductor device 1 includes: a silicon substrate 10 (semiconductor substrate) in which an integrated circuit (not shown) including semiconductor elements such as a transistor and a memory element is formed; a first electrode 11 provided on or above an active face 10a of the silicon substrate 10, that is, the side on which the integral circuit is formed; an external connection terminal 12 electrically connected to the first electrode and provided on or above the active face 10a; and a connection terminal 13 provided on or above the active face 10a The first electrode 11 is formed by directly conducting to the integrated circuit of the silicon substrate 10, and as shown in FIG. 2, for example, a plurality thereof are arrayed in the periphery of the rectangular silicon substrate 10.

On the active face 10a, as shown in FIG. 1, a first insulating layer 14 functioning as a passivation film is formed.

In the first insulating layer 14, an opening 14a is formed above the first electrode 11.

In this configuration, the first electrode 11 is outwardly exposed in the opening 14a.

On the first insulating layer 14, a stress-relieving layer 15 made of an insulating resin is formed while avoiding the region of the first electrode 11 and a second electrode (described later), and the region therefor in this embodiment at the center of the silicon substrate 10.

An interconnection layer 16 is connected to the first electrode 11 in the opening 14a of the insulating layer 14.

This interconnection layer 16 is used for relocation of an electrode of the integrated circuit. As shown in FIG. 2, the interconnection layer 16 is formed to extend from the first electrode 11 arranged in the periphery of the silicon substrate 10 toward the central portion, and to extend from the upper surface of the silicon substrate 10 toward the upper surface of the stress-relieving layer 15 as shown in FIG. 1.

This interconnection layer 16 connects between the first electrode 11 of the silicon substrate 10 and the external connection terminal 12 to be described later. Hence it is generally referred to as a relocated wiring.

In order to arrange the region of the first electrode 11 of the silicon substrate 10 which is often finely designed, in a physically-displaced relationship with the region of the rough-pitched external connection terminal 12 which is used for board packaging, such a relocated wiring is used.

On or above the active face 10a of the silicon substrate 10, a second insulating layer 17 made of a solder resist is formed and covers the interconnection layer 16, the stress-relieving layer 15, and the first insulating layer 14.

In the second insulating layer 17, an opening 17a is formed on the interconnection layer 16 above the stress-relieving layer 15.

In this configuration, the interconnection layer 16 is outwardly exposed in the opening 17a.

On the interconnection layer 16 exposed in the opening 17a, the external connection terminal 12 is disposed.

The external connection terminal 12 is formed, for example, in a bump shape of a solder ball, and electrically connected to a printed wiring board P (circuit board) as an external device which is shown with a double-dot chain line in FIG. 1.

In this configuration, the integrated circuit (semiconductor element) formed on the silicon substrate 10 is electrically connected to the printed wiring board P via the first electrode 11, the interconnection layer 16 as a relocated wiring, and the external connection terminal 12.

In the integrated circuit formed on the silicon substrate 10, a second electrode 18 is formed in addition to the first electrode, as shown in FIG. 2.

The second electrode 18 is used for outputting a signal to drive a functional structure other than the printed wiring board P, or for electrically performing various functional checkups and adjustments of the integrated circuit.

In this embodiment, as in the case of the first electrode 1, the second terminal 18 is connected to a relocated wiring 19. The relocated wiring 19 is connected to the connection terminal 13 exposed outwardly.

The connection terminal 13 is a pad-shaped portion for electrical or mechanical connection.

Especially, in the case in which the second electrode 18 is an electrode for outputting an output signal to drive a functional structure, the connection terminal 13 is suitably utilized for connecting the semiconductor device 1 of this embodiment to a functional structure other than the printed wiring board P.

As described above, in the case in which the second electrode 18 is an electrode for electrically performing various functional checkups and adjustments of the integrated circuit, the connection terminal 13 is suitably utilized for electrical connection with a checkup or adjustment probe, or the like.

After various functional checkups and adjustments of the integrated circuit, the connection terminal 13 is sealed with a sealing resin 20 of epoxy resin, or the like, as shown with a double-dot chain line in FIG. 1.

In this structure, the connection terminal temporarily used for the functional checkup or adjustment is secluded (insulated) from the external environment subsequent to the sealing.

Therefore, it is possible to seclude the connection terminal from situations that may deteriorate the reliability of the semiconductor element.

The first electrode 11, the second electrode 18, and the connection terminal 13 are formed of titanium (Ti), titanium nitride (TiN), aluminum (Al), copper (Cu), or an alloy of these.

Especially for the connection terminal, it is preferable that the surface thereof be plated with nickel (Ni) or gold (Au) for enhancing, for example, the electrical connection with the probe or the junction in bonding.

It is possible to prevent a decrease in connection or junction performance caused especially by rust.

The connection terminal may be subjected to an outermost surface treatment such as solder plating or solder precoat.

The interconnection layer 16 and the relocated wiring 19 are formed of gold (Au), copper (Cu), titanium (Ti), tungsten (W), titanium tungsten (TiW), titanium nitride (TiN), nickel (Ni), nickel vanadium (NiV), chromium (Cr), aluminum (Al), palladium (Pd), or the like.

The interconnection layer 16 and the relocated wiring 19 may have a single-layer configuration of one of the above materials, or a laminated-layer configuration obtained by combining a plurality of them.

The interconnection layer 16 and the relocated wiring 19 are made of the same material, because they are generally formed in the same process.

The first insulating layer 14 and the second insulating layer 17 can be formed from a resin such as a polyimide resin, a modified silicone polyimide resin, an epoxy resin, a modified silicone epoxy resin, an acrylic resin, a phenol resin, a benzocyclobutene (BCB), and a polybenzoxazole (PBO).

The first insulating layer 14 may be formed from an inorganic insulating material such as silicon oxide ($SiO_2$) and silicon nitride ($Si_3N_4$).

Manufacturing Method for Semiconductor Device

Next, a manufacturing method for the semiconductor device 1 with the above configuration will be described with reference to FIG. 3.

Figure 4:
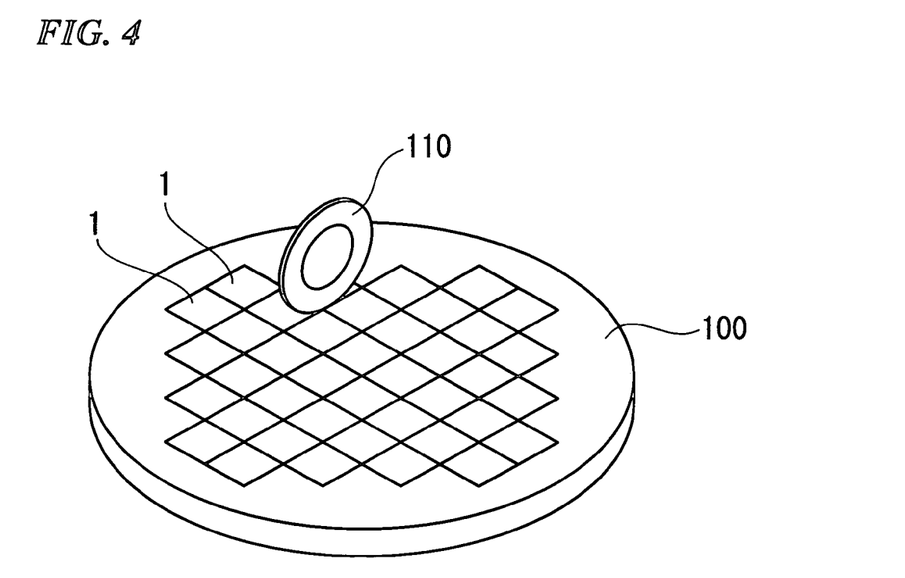
FIG. 4 is a perspective view for explanation of a manufacturing method for the semiconductor device of FIG. 1.

In this embodiment, as shown in FIG. 4, the semiconductor devices are formed simultaneously on one silicon wafer (substrate) 100. The silicon wafer 100 is then diced (cut) into individual semiconductor devices 1 to obtain the semiconductor device 1.

Figure 3A:
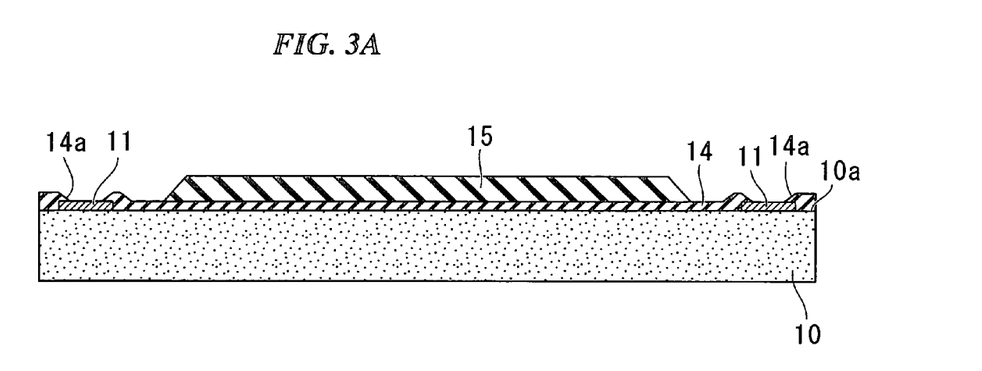
FIGS. 3A to 3C are cross-sectional views for explanation of a manufacturing method for the semiconductor device of FIG. 1.
Figure 3B:
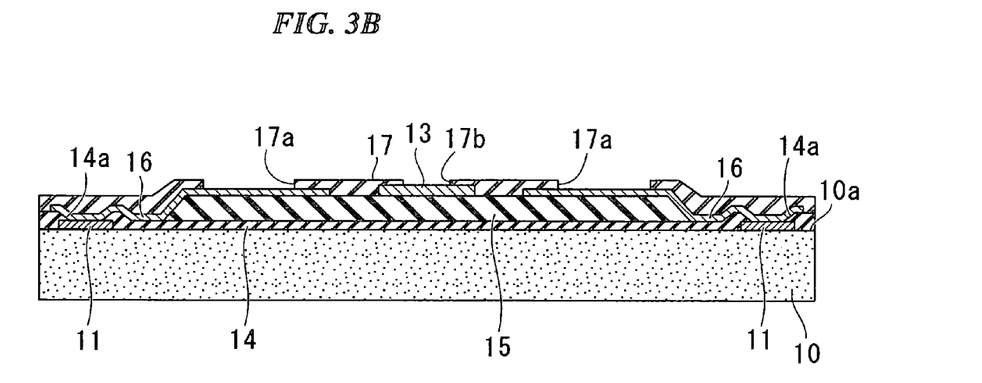
Figure 3C:
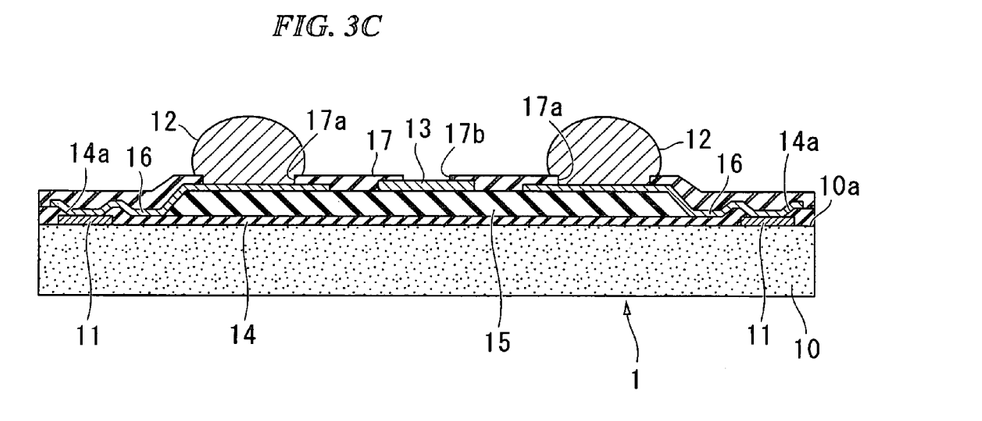

In FIGS. 3A to 3C, only one silicon semiconductor device 1 is shown for a simplified description.

First, as shown in FIG. 3A, in a region of the active face 10a of the silicon substrate 10, on which a conductive portion for the integrated circuit will be formed, a first electrode 11 and a second electrode 18 (not shown in FIG. 3A, see FIG. 2) are formed.

Next, the first insulating layer 14 is formed on the silicon substrate 10 and covers the first electrode 11 and the second electrode 18. Then a resin layer (not shown) is formed to cover the first insulating layer 14.

Next, the resin layer is patterned by known methods of photolithography and etching, the stress-relieving layer 15 is formed in a predetermined shape in the central region of the silicon substrate 10 i.e., in a shape avoiding the region directly above the first electrode 11 and the second electrode 18.

The insulating material in the region covering the first electrode 11 and the second electrode 18 is removed by known methods of photolithography and etching to form the opening 14a. Thereby, the first electrode 11 and the second electrode 18 are exposed in the opening 14a.

Next, as shown in FIG. 3B, the interconnection layer 16 connected to the first electrode 11 is formed, and the relocated wiring 19 connected to the second electrode 18 is formed.

The method for forming the interconnection layer 16 and relocated wiring 19 includes steps such as: forming a layer of a conductive material for conduction with the first electrode 11 and the second electrode 18 in the above opening 14a; forming a layer by sequentially sputtering, for example, TiW and Cu for patterning in the interconnection layer 16; and subsequently laminating Cu on the obtained pattern by plating.

An end of the relocated wiring 19, specifically as shown in FIG. 2, an end region opposite to the second electrode 18 in the relocated wiring 19 is formed as a connection terminal by patterning in a pad shape.

Especially for this connection terminal, the electrical connectivity or the junction performance in wire-bonding are increased by plating of nickel (Ni) or gold (Au) on the surface of the connection terminal. Thus, the connection terminal 13 of this invention is formed.

The connection terminal 13 may be subjected to an outermost surface treatment such as solder plating or solder precoat.

Next, the second insulating layer 17 covering the interconnection layer 16, the relocated wiring 19, and the connection terminal 13 is formed.

Then, an insulating material covering a part of the interconnection layer 16, specifically, a region opposite to the first electrode 11 in the connection layer 16 is removed by known methods of photolithography and etching to form the opening 17a.

The interconnection layer 16 is exposed in the opening 17a.

At the same time, an insulating material covering the connection terminal 13 is also removed to form an opening 17b, thus exposing the connection terminal 13 in the opening 17b.

Subsequently, as shown in FIG. 3C, a solder ball of Pb-free solder, or the like, is disposed on the interconnection layer 16 exposed in the opening 17a, to form the external connection terminal 12.

As the forming of the external connection terminal 12, the external connection terminal 12 may be formed by printing solder paste on the interconnection layer 16, instead of by disposing a solder ball.

As shown in FIG. 4, a dicing device 110 is then used to dice (cut) the silicon wafer (substrate) 100 into individual semiconductor devices 1 to obtain a semiconductor device 1.

In a semiconductor device 1 thus obtained, especially in the case in which the connection terminal 13 is used for checkup or adjustment, specifically, in the case in which the second terminal 18 is used for various electrical checkups or adjustments of the integrated circuit, the second terminal 18 utilizes this connection terminal 13.

More specifically, the function of the integrated circuit is checked or adjusted by IC probe checkup, trimming (fuse cutting), or the like, performed simultaneously with the probe checkup In the case in which the connection terminal 13 is used only for a functional checkup or adjustment of the integrated circuit, the connection terminal 13 is sealed with the sealing resin 20 as described above after the completion of the checkup or adjustment.

In this manner, in the case in which the connection terminal 13 of this invention especially for a functional checkup or adjustment of the integrated circuit is used, the quality stability of the semiconductor device 1 is secured and the reliability thereof is increased.

Specifically, since the external terminal 12 is used for packaging by the user, it is necessary to generally widen the terminal pitch thereof.

Therefore, all the terminals may not be drawn as external connection terminals from the integrated circuit (IC) due to limitations in design.

In contrast to this, this embodiment is provided with the connection terminal 13 in addition to the external connection terminal 12. The connection terminal 13 is utilized for a functional checkup or adjustment of the integrated circuit, which can lessen the limitations in design with respect to the external connection terminal 12 and increase the freedom in design.

In this invention, the connection terminal 13 does not interfere with the region of the external connection terminal 12. Therefore, as described above, the connection terminal 13 may be extended from the second terminal 18 to any region via the relocated wiring 19, the only requirement being that the region does not impair the degree of freedom in design.

The connection terminal 13 may be arranged on any position on the relocated wiring 19, and in addition, may be directly disposed on the second terminal 18 without using the relocated wiring 19.

The connection terminal 13 may be a terminal which is formed directly in a part of the relocated wiring 13, as described above.

The connection terminal 13 may be formed with a pad, or the like, independently of the relocated wiring 19 or the second electrode 18.

In the case in which the connection terminal 13 is used as a terminal for adjustment, a terminal for data writing, a terminal which must not be exposed to the user, or the like, the connection terminal 13 of this invention may be sealed with a sealing resin 20 especially after the completion of the functional checkup or adjustment, preventing the subsequent adjustment, or the like, through the connection terminal 13.

Therefore, the state at the completion of the checkup or the adjustment can be kept as it is. It is possible to secure the quality stability of the semiconductor device 1 and increase the reliability thereof.

All the connection terminals 13 obtained as above may be used for a functional checkup or adjustment of the integrated circuit. However, only some of the connection terminals 13 may be used for a functional checkup or adjustment of the integrated circuit and the other connection terminals 13 may be utilized for connection to functional structures other than the printed wiring board P.

All the connection terminals 13 may be utilized for connection to other functional structures.

Electronic Component

An electronic component of this invention using the above semiconductor device 1 will be described.

An electronic component of this invention is constituted by integrating the semiconductor device 1 into a functional structure.

Figure 5:
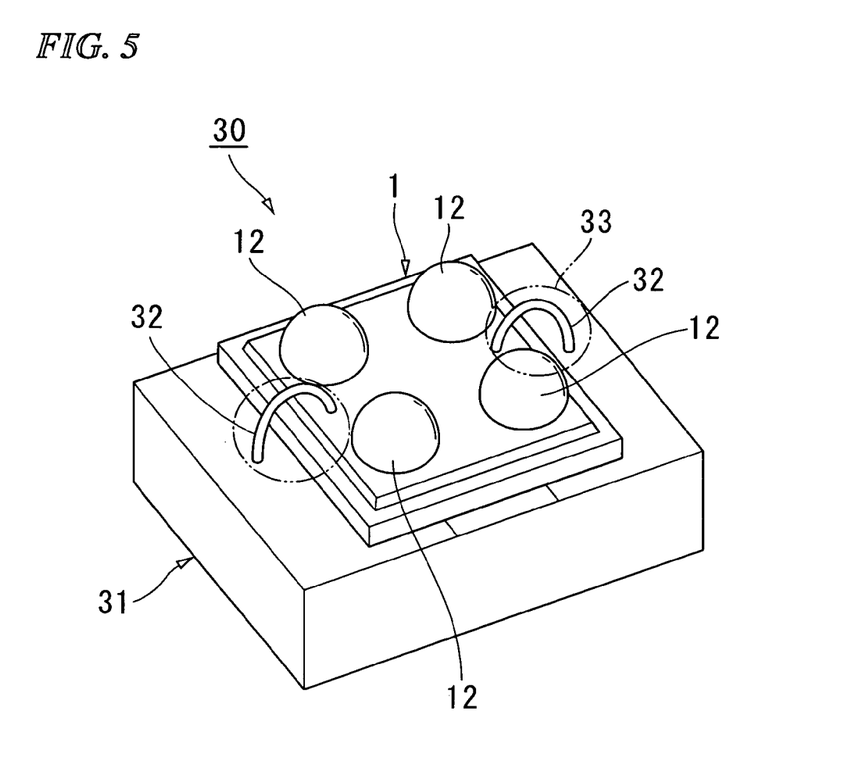
FIG. 5 is a perspective view of an embodiment of an electronic component according to this invention.

FIG. 5 is a perspective view that shows an embodiment of an electronic component of this invention. In FIG. 5, reference numeral 30 denotes the electronic component.

The electronic component 30 includes the semiconductor device 1 and a functional structure 31.

As the functional structure 31, any of various types of functional structures can be used without particular limitation.

Specifically, a crystal oscillator, a piezoelectric oscillator, a piezoelectric tuning fork, a Surface Acoustic Wave (SAW) element, a MEMS structure, a semiconductor device other than the semiconductor device 1, any of other electronic component structures of various types, or the like, can be used.

The semiconductor device 1 is used, in particular, for driving this functional structure 31.

Specifically, in this embodiment, the second electrode 18 in the semiconductor device 1 functions as an electrode for outputting an output signal to drive the functional structure 31, and the connection terminal 13 connected to the second electrode 18 is electrically connected to a connection terminal (not shown) on or above the functional structure 31.

In the electronic component 30 of this invention, the semiconductor device 1 is packaged on the upper face of the functional structure 31, and fixed thereon with an adhesive, or the like.

The semiconductor device 1 is packaged on the functional structure 31 such that the active face thereof faces outward. The functional structure 31 is thereby joined on the opposite side of the active face 10a of the semiconductor device 1.

In this configuration, the connection terminal 13 and the connection terminal of the functional structure 31 are connected by a conductive connection portion on the upper face of the functional structure 31 and on the upper face of the semiconductor device 1.

It is simple and preferable in wire bonding using gold wire 32 to be applied as a conductive connection portion.

The packaging technique, however, is not limited to this. Other known packaging techniques such as wire connection by soldering, beam lead, and TAB can also be adopted.

Since this wire-bonding using the gold wire 32 is applied on or above the same face as the active face 10a of the semiconductor device 1, the gold wire 32 is formed on the same face as the external connection terminal 12 of the semiconductor device 1, as shown in FIG. 5.

When the electronic component 30 is packaged in the printed wiring board P, the electronic component 30 is packaged via the external connection terminal 12. Therefore, the gold wire 32 faces the printed wiring board P.

In this embodiment, in order to prevent the gold wire 32 from abutting on the printed wiring board P especially when packaging, the height of this gold wire (the height of the bonding wire), to be specific, the top height of the gold wire 32 (the distance from the active face 10a to the top of the gold wire 32) is lower than the height of the external connection terminal 12 (the distance from the active face 10a to the top of the external connection terminal 12).

By this means, the gold wire 32 from interfering with the printed wiring board P (external apparatus) is prevented when the electronic component 30 is connected to the printed wiring board P via the external connection terminal 12.

Thus, a desirably connection is obtained without bringing about short-circuiting, or the like, between the external connection terminal 12 and the gold wire 32.

It is preferable that the connection terminal 13 be sealed with a sealing resin 33 as shown with a double-dot chain line in FIG. 5 after the connection terminal 13 and the connection terminal on or above the functional structure 31 are wire-bonded.

It is possible to increase the bonding strength of the gold wire 32 with respect to the connection terminal 13.

Since the connection terminal 13 and the gold wire 32 are coated with a resin, it is possible to also decrease the damage to the connection section configuration caused in subsequent processes, and tremendously improve connection reliability.

In the case in which this electronic component 30 is manufactured, the external connection terminal 12 may be formed after a silicon wafer is diced to obtain individual semiconductor devices 1 without forming an external connection terminal 12 by wire bonding on each semiconductor device 1 prior to the dicing, and then wire bonding is performed between the individual semiconductor device 1 and the functional structure 31.

As described above, in the semiconductor device 1 of this embodiment, the connection terminal 13 is provided in addition to the external connection terminal 12. Thus, this semiconductor device 1 and the finctional structure 31 can be integrated to form the electronic component 30 by mechanically or electrically connecting the semiconductor device 1 to the functional structure 31 using the connection terminal 13. Therefore, it is possible to miniaturize the electronic component 30.

Since the stress-relieving layer 15 is provided between the silicon substrate 10 and the external connection terminal 12, thus, even if a stress due to, for example, pressure or heat develops in the external connection terminal 12 when the semiconductor device 1 is connected to the external apparatus such as the printed wiring board P via the external connection terminal 12, the stress-relieving layer 15 relieves the stress, thereby preventing inconvenience such as a break in the wire.

Therefore, it is possible to improve the connection reliability between the external connection terminal 12 and the external apparatus such as the printed wiring board P.

Since, in the electronic component 30 of this embodiment, the semiconductor device 1 and the finctional structure 31 are connected by wire bonding utilizing the connection terminal 13, the semiconductor device 1 and the functional structure 31 can be integrated easily only with known techniques to form an electronic component with a three-dimensional configuration.

Therefore, it is possible to sufficiently miniaturize the component as an aggregate, and in addition, to reduce the cost thereof.

This invention is not limited to the above-described embodiments and various modifications can be made as long as they do not depart from the spirit or scope of this invention.

For example, in the embodiment shown in FIG. 5, wire bonding is applied to the connection terminal 13 for electrical connection. However, the connection terminal 13 may be used only for mechanical connection.

Specifically, the connection terminal 13 may be used as a wire-bonding configuration in which the connection terminal 13 is formed by using a metal, or the like, as a land electrically independent of the integrated circuit formed on the silicon substrate 10, with the only actualization of mechanically connecting the functional structure 31 and the silicon substrate 10.

Specifically, in the case in which a suspension configuration is adopted in which the semiconductor device 1 is suspended with respect to the functional structure 31, in the case in which it is difficult to use an adhesive or sufficient junction strength cannot be obtained only with an adhesive, or the like, mechanical connection with a wire-bonding configuration utilizing the connection terminal 13 may be adopted.

Figure 6:
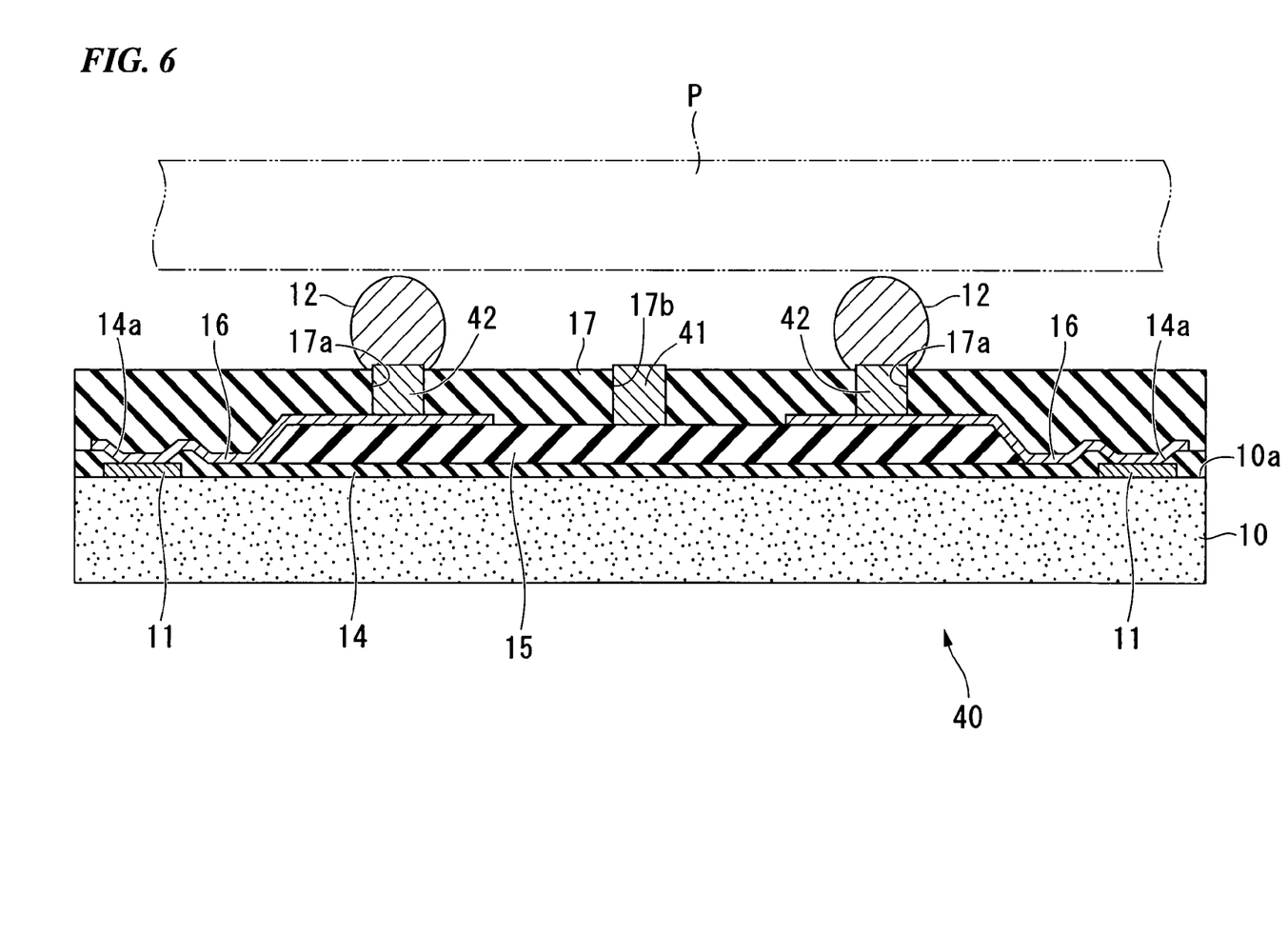
FIG. 6 is a cross-sectional view of another embodiment of a semiconductor device according to this invention.

For the configuration of the connection terminal 13, a columnar (post) configuration shown in FIG. 6 may be adopted instead of a pad configuration shown in FIG. 1.

In a semiconductor device 40 shown in FIG. 6, a connection terminal 41 is formed of, for example, copper in a columnar (post) shape. The upper face thereof working as a connection face is plated with Ni-Au for prevention of surface rust and for improvement of bonding.

In this semiconductor device 40, a post 42 is formed also between the external connection terminal 12 and the layer 16. The post 42 is formed by the same process as that for the connection terminal 41.

By this means, the external connection terminal 12 and the connection layer 16 is electrically connected on or above the upper face of the second insulating layer 17 via the post 42.

With regard to this configuration, the columnar connection terminal 41 functions as an upper- and lower-layers conductive member for electrically conducting, for example, the second electrode 18 as a conductive section of the lower layer or the relocated wiring 19 and a conductive layer (not shown) formed in the upper layer (the layer above the second insulating layer 17) as required. Thus, it is possible to enhance the freedom of relocated wiring in the overall semiconductor device 40.

Circuit board and Electronic Device

A circuit board of this invention is configured by packaging the electronic component 30 in, for example, the printed wiring board P shown with a double-dot chain line in FIG. 1.

Specifically, a circuit board as an embodiment of this invention is configured by electrically connecting the external connection terminal 12 of the semiconductor device 1 (40) in the electronic component 30 to a conductive section of the printed wiring board P.

This circuit board is packaged with the miniaturized electronic component, allowing high density packaging accordingly. Therefore, function of the circuit board can be enhanced.

An electronic device of this invention is also packaged with the electronic component.

Figure 7:
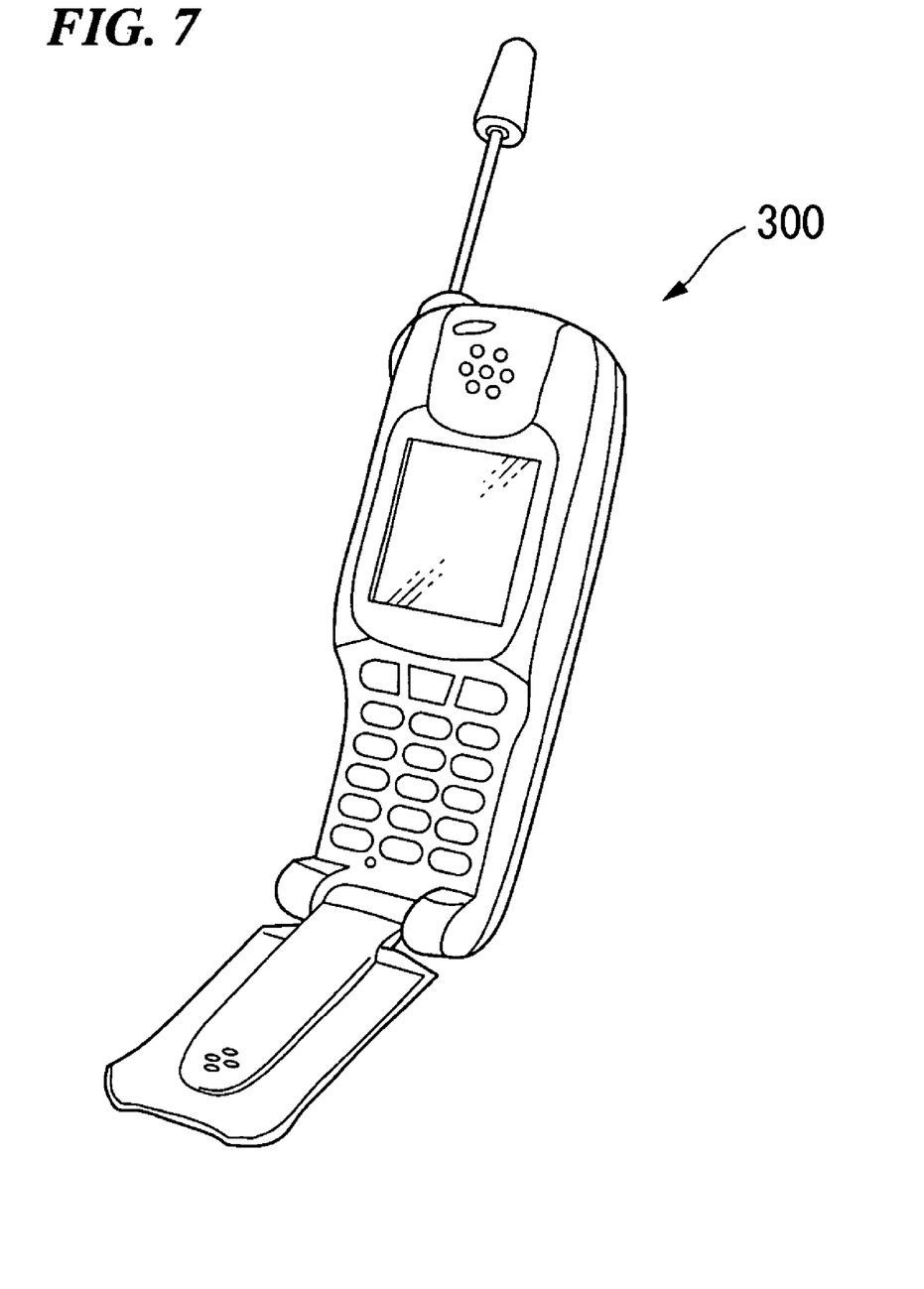
FIG. 7 is a perspective view of an example of an electronic device in which an electronic component according to this invention is packaged.

Specifically, a portable telephone 300 shown in FIG. 7 is an example of an electronic device packaged with the electronic component 30.

This electronic device is also packaged with the miniaturized electronic component, allowing high density packaging accordingly. Therefore, function of the circuit board can be enhanced.

Other electronic devices to which this invention is applicable include, for example, an IC card, a video camera, a personal computer, a head-mount display, a projector, a facsimile apparatus, a digital camera, a portable TV, a DSP device, a PDA, and an electronic notebook.

What is claimed is:

1. A semiconductor device comprising:
    a semiconductor substrate having an active face;
    a first electrode provided on or above the active face;
    an external connection terminal provided on or above the active face and electrically connected to the first electrode; and
    a connection terminal provided on the same face of the semiconductor substrate where the external connection is provided, for connecting the semiconductor device with a functional structure which is disposed on or above a face on an opposite side of the active face of the semiconductor substrate in the semiconductor device and is driven with the semiconductor device.

2. The semiconductor device according to claim 1, further comprising:
    a relocated wiring electrically connecting the first electrode with the external connection terminal and provided on or above the active face.

3. The semiconductor device according to claim 1, further comprising:
a second electrode electrically connected with the connection terminal and provided on or above the active face of the semiconductor substrate.

4. The semiconductor device according to claim 1, wherein the connection terminal is used when an electrical checkup or adjustment is performed.

5. The semiconductor device according to claim 1, wherein the connection terminal is a terminal for electrically connecting to a component different from that connected to the external connection terminal.

6. The semiconductor device according to claim 1, further comprising:
a stress-relieving layer provided between the semiconductor substrate and the external connection terminal; and
an interconnection layer connecting the external connection terminal with the first electrode.

7. The semiconductor device according to claim 1, further comprising:
a sealing resin sealing the connection terminal.

8. The semiconductor device according to claim 1, wherein the connection terminal is formed in a columnar shape.

9. An electronic component comprising:
a semiconductor device including: a semiconductor substrate having an active face; a first electrode provided on or above the active face of the semiconductor substrate; an external terminal provided on or above the active face and electrically connected to the first electrode; and a connection terminal provided on the same face of the semiconductor substrate where the external connection is provided;
a functional structure disposed on or above a face on an opposite side of the active face of the semiconductor substrate in the semiconductor device; and
a conductive connection portion electrically connecting the functional structure with the connection terminal, wherein
the functional structure is driven with the semiconductor device.

10. The electronic component according to claim 9, wherein the conductive connection portion is a wire which connects the functional structure with the connection terminal by wire bonding.

11. The electronic component according to claim 10, wherein the top of the external connection terminal is higher than that of the conductive connection portion.

12. The electronic component according to claim 9, further comprising:
a sealing resin sealing the conductive connection portion.

13. A circuit board comprising the electronic component according to claim 9, wherein the electronic component is packaged on the circuit board.

14. An electronic device comprising the electronic component according to claim 9, wherein the electronic component is packaged in the electronic device.

* * * * *